United States Patent
Schwab et al.

(10) Patent No.: US 10,163,826 B2
(45) Date of Patent: Dec. 25, 2018

(54) PACKAGED MICROELECTRONIC DEVICES AND METHODS FOR MANUFACTURING PACKAGED MICROELECTRONIC DEVICES

(71) Applicant: Micron Technology, Inc., Boise, ID (US)

(72) Inventors: Matt E. Schwab, Boise, ID (US); David J. Corisis, Nampa, ID (US); J. Michael Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/787,041

(22) Filed: Oct. 18, 2017

(65) Prior Publication Data
US 2018/0040582 A1 Feb. 8, 2018

Related U.S. Application Data

(62) Division of application No. 14/506,423, filed on Oct. 3, 2014, now Pat. No. 9,812,415, which is a division
(Continued)

(51) Int. Cl.
*H01L 23/31* (2006.01)
*H01L 23/498* (2006.01)
(Continued)

(52) U.S. Cl.
CPC .............. *H01L 24/03* (2013.01); *H01L 21/56* (2013.01); *H01L 23/3128* (2013.01); *H01L 23/49811* (2013.01); *H01L 23/49816* (2013.01); *H01L 24/06* (2013.01); *H01L 24/09* (2013.01); *H01L 24/17* (2013.01); *H01L 24/29* (2013.01); *H01L 24/32* (2013.01); *H01L 24/49* (2013.01);
(Continued)

(58) Field of Classification Search
None
See application file for complete search history.

(56) References Cited

U.S. PATENT DOCUMENTS 5,062,565 A 11/1991 Wood et al.
5,593,927 A 1/1997 Farnworth et al.
(Continued)

OTHER PUBLICATIONS

Peter, R., "Ultra-low Profile Chip Scale Package Challenges for 300mm Die Bonder," pp. 1-5, Business Briefing: Global Semiconductor Manufacturing Technology 2003, Business, Briefings Ltd., London, Aug. 2003.

*Primary Examiner* — Alexander Ghyka
(74) *Attorney, Agent, or Firm* — Perkins Coie LLP

(57) ABSTRACT

Packaged microelectronic devices and methods for manufacturing packaged microelectronic devices are disclosed. In one embodiment, a system comprises a semiconductor component including an interposer substrate, a microelectronic die over the interposer substrate, and a connection structure composed of a volume of solder material between the interposer substrate and the microelectronic die. The connection structure can include at least one of (a) a single, unitary structure covering approximately all of the back side of the microelectronic die, and (b) a structure electrically isolated from internal active features of the microelectronic die. In some embodiments, the connection structure can be positioned to provide generally consistent stress distribution within the system.

9 Claims, 4 Drawing Sheets

Related U.S. Application Data of application No. 13/155,203, filed on Jun. 7, 2011, now Pat. No. 8,866,272, which is a division of application No. 11/685,621, filed on Mar. 13, 2007, now Pat. No. 7,955,898.

(51) Int. Cl.
  *H01L 23/00* (2006.01)
  *H01L 21/56* (2006.01)

(52) U.S. Cl.
  CPC .............. *H01L 24/73* (2013.01); *H01L 24/81* (2013.01); *H01L 24/83* (2013.01); *H01L 24/85* (2013.01); *H01L 24/28* (2013.01); *H01L 24/48* (2013.01); *H01L 2224/0401* (2013.01); *H01L 2224/11011* (2013.01); *H01L 2224/13111* (2013.01); *H01L 2224/1405* (2013.01); *H01L 2224/16225* (2013.01); *H01L 2224/2919* (2013.01); *H01L 2224/29111* (2013.01); *H01L 2224/32225* (2013.01); *H01L 2224/48091* (2013.01); *H01L 2224/48227* (2013.01); *H01L 2224/48235* (2013.01); *H01L 2224/73204* (2013.01); *H01L 2224/73257* (2013.01); *H01L 2224/73265* (2013.01); *H01L 2224/81192* (2013.01); *H01L 2224/81801* (2013.01); *H01L 2224/81815* (2013.01); *H01L 2224/83102* (2013.01); *H01L 2224/83192* (2013.01); *H01L 2224/83801* (2013.01); *H01L 2224/85* (2013.01); *H01L 2224/92125* (2013.01); *H01L 2224/92247* (2013.01); *H01L 2924/00014* (2013.01); *H01L 2924/014* (2013.01); *H01L 2924/0105* (2013.01); *H01L 2924/01005* (2013.01); *H01L 2924/01029* (2013.01); *H01L 2924/0132* (2013.01); *H01L 2924/0133* (2013.01); *H01L 2924/01033* (2013.01); *H01L 2924/01047* (2013.01); *H01L 2924/01079* (2013.01); *H01L 2924/01082* (2013.01); *H01L 2924/0665* (2013.01); *H01L 2924/10158* (2013.01); *H01L 2924/10253* (2013.01); *H01L 2924/14* (2013.01); *H01L 2924/1579* (2013.01); *H01L 2924/15174* (2013.01); *H01L 2924/15184* (2013.01); *H01L 2924/15311* (2013.01); *H01L 2924/181* (2013.01); *H01L 2924/3511* (2013.01)

(56) References Cited

U.S. PATENT DOCUMENTS

| | | |
|---|---|---|
| 5,677,566 A | 10/1997 | King et al. |
| 5,696,033 A | 12/1997 | Kinsman |
| 5,739,585 A | 4/1998 | Akram et al. |
| D394,844 S | 6/1998 | Farnworth et al. |
| D402,638 S | 12/1998 | Farnworth et al. |
| 5,851,845 A | 12/1998 | Wood et al. |
| 5,891,753 A | 4/1999 | Akram |
| 5,893,726 A | 4/1999 | Farnworth |
| 5,898,224 A | 4/1999 | Akram |
| 5,933,713 A | 8/1999 | Farnworth |
| 5,938,956 A | 8/1999 | Hembree et al. |
| 5,958,100 A | 9/1999 | Farnworth et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,008,074 A | 12/1999 | Farnworth |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,072,236 A | 6/2000 | Akram et al. |
| 6,075,288 A | 6/2000 | Akram |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,117,382 A | 9/2000 | Thummel |
| 6,124,634 A | 9/2000 | Akram et al. |
| 6,130,474 A | 10/2000 | Corisis |
| 6,150,717 A | 11/2000 | Wood et al. |
| 6,159,764 A | 12/2000 | Kinsman et al. |
| 6,165,887 A | 12/2000 | Ball |
| 6,172,419 B1 | 1/2001 | Kinsman |
| 6,184,465 B1 | 2/2001 | Corisis |
| 6,198,172 B1 | 3/2001 | King et al. |
| 6,208,025 B1 * | 3/2001 | Bellaar ............. H01L 23/49816 257/688 |
| 6,208,519 B1 | 3/2001 | Jiang et al. |
| 6,210,992 B1 | 4/2001 | Tandy et al. |
| 6,215,175 B1 | 4/2001 | Kinsman |
| 6,228,548 B1 | 5/2001 | King et al. |
| 6,229,202 B1 | 5/2001 | Corisis |
| 6,246,108 B1 | 6/2001 | Corisis et al. |
| 6,252,308 B1 | 6/2001 | Akram et al. |
| 6,258,624 B1 | 7/2001 | Corisis |
| 6,259,153 B1 | 7/2001 | Corisis |
| 6,261,865 B1 | 7/2001 | Akram |
| 6,277,671 B1 | 8/2001 | Tripard |
| 6,281,041 B1 | 8/2001 | Wang et al. |
| 6,284,571 B1 | 9/2001 | Corisis et al. |
| 6,291,894 B1 | 9/2001 | Farnworth et al. |
| 6,294,831 B1 | 9/2001 | Shishido et al. |
| 6,294,839 B1 | 9/2001 | Mess et al. |
| 6,303,981 B1 | 10/2001 | Moden |
| 6,303,985 B1 | 10/2001 | Larson et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,331,221 B1 | 12/2001 | Cobbley |
| 6,331,453 B1 | 12/2001 | Bolken et al. |
| 6,332,766 B1 | 12/2001 | Thummel |
| 6,365,434 B1 | 4/2002 | Rumsey et al. |
| 6,451,709 B1 | 9/2002 | Hembree |
| 6,548,757 B1 | 4/2003 | Russell et al. |
| 6,558,600 B1 | 5/2003 | Williams et al. |
| 6,561,479 B1 | 5/2003 | Eldridge |
| 6,564,979 B2 | 5/2003 | Savaria |
| 6,576,494 B1 | 6/2003 | Farnworth |
| 6,576,495 B1 * | 6/2003 | Jiang .................... H01L 21/563 257/E21.503 |
| 6,589,820 B1 | 7/2003 | Bolken |
| 6,614,092 B2 | 9/2003 | Eldridge et al. |
| 6,622,380 B1 | 9/2003 | Grigg |
| 6,638,595 B2 | 10/2003 | Rumsey et al. |
| 6,644,949 B2 | 11/2003 | Rumsey et al. |
| 6,650,013 B2 | 11/2003 | Yin et al. |
| 6,653,173 B2 | 11/2003 | Bolken |
| 6,670,719 B2 | 12/2003 | Eldridge et al. |
| 6,672,325 B2 | 1/2004 | Eldridge |
| 6,673,649 B1 | 1/2004 | Hiatt et al. |
| 6,738,263 B2 * | 5/2004 | Corisis ................ H01L 23/3107 174/524 |
| 6,798,057 B2 * | 9/2004 | Bolkin .................. H01L 25/105 257/637 |
| 6,856,009 B2 * | 2/2005 | Bolken ............. H01L 23/3128 257/686 |
| 7,955,898 B2 | 6/2011 | Schwab et al. |
| 2003/0215981 A1 | 11/2003 | Strouse et al. |

(56) References Cited

U.S. PATENT DOCUMENTS

| | | |
|---|---|---|
| 2004/0216917 A1 | 11/2004 | Amir et al. |
| 2006/0051897 A1 | 3/2006 | Stroupe |
| 2006/0220211 A1* | 10/2006 | Yamazaki ............... C30B 13/24 257/686 |
| 2007/0069391 A1* | 3/2007 | Gritti ................. H01L 25/0657 257/777 |
| 2007/0069394 A1 | 3/2007 | Bachman et al. |
| 2007/0131912 A1 | 6/2007 | Simone et al. |
| 2008/0224329 A1 | 9/2008 | Schwab et al. |
| 2011/0233740 A1 | 9/2011 | Schwab et al. |
| 2015/0021769 A1 | 1/2015 | Schwab et al. |

* cited by examiner

PACKAGED MICROELECTRONIC DEVICES AND METHODS FOR MANUFACTURING PACKAGED MICROELECTRONIC DEVICES

CROSS-REFERENCE TO RELATED APPLICATIONS

This application is a divisional of U.S. application Ser. No. 14/506,423 filed Oct. 3, 2014, which is a divisional of U.S. application Ser. No. 13/155,203 filed Jun. 7, 2011, now U.S. Pat. No. 8,866,272, which is a divisional of U.S. application Ser. No. 11/685,621 filed Mar. 13, 2007, now U.S. Pat. No. 7,955,898, each of which is incorporated herein by reference in its entirety.

TECHNICAL FIELD

The present disclosure is related to packaged microelectronic devices and methods for manufacturing packaged microelectronic devices.

BACKGROUND

Processors, memory devices, imagers and other types of microelectronic devices are often manufactured on semiconductor workpieces or other types of workpieces. In a typical application, several individual dies (e.g., devices) are fabricated on a single workpiece using sophisticated and expensive equipment and processes. Individual dies generally include an integrated circuit and a plurality of bond-pads coupled to the integrated circuit. The bond-pads provide external electrical contacts on the die through which supply voltage, signals, etc., are transmitted to and from the integrated circuit. The bond-pads are usually very small, and they are arranged in an array having a fine pitch between bond-pads. The dies can also be quite delicate. As a result, after fabrication, the dies are packaged to protect the dies and to connect the bond-pads to another array of larger terminals that is easier to connect to a printed circuit board.

Conventional processes for packaging dies include electrically coupling the bond-pads on the dies to an array of pins, ball-pads, or other types of electrical terminals, and then encapsulating the dies to protect them from environmental factors (e.g., moisture, particulates, static electricity, and physical impact). In one application, the bond-pads are electrically connected to contacts on an interposer substrate that has an array of ball-pads. FIG. 1A, for example, schematically illustrates a conventional packaged microelectronic device 10 including an interposer substrate 20 having an array of external contacts 22, a microelectronic die 30 attached to the interposer substrate 20, and a plurality of wire-bonds 32 electrically coupling the die 30 to the external contacts 22 of the interposer substrate 20. The die 30 is attached to the interposer substrate 20 with a generally flexible adhesive material 50 (e.g., epoxy, tape, etc.). The die 30 has been encapsulated with a casing 60 to protect the die 30 and corresponding wire-bonds 32 from environmental factors.

One drawback of this conventional arrangement is that stresses within the device 10 can cause the device 10 to bow or warp after encapsulation. FIG. 1B, for example, is a view of the device 10 after the device has bowed, with the amount of bowing highly exaggerated for purposes of illustration. The bowing can be caused by several factors, such as an asymmetrical stress distribution within the device caused by the difference between the coefficients of thermal expansion of the interposer substrate 20, the microelectronic die 30, and the casing 60. The generally flexible or compliant adhesive material 50 moves along with the substrate 20 and die 30, and does little or nothing to prevent the bowing or warpage of the device 10. The warpage can cause the solder links between the interposer substrate 20 and a printed circuit board (not shown) to which the interposer substrate 20 is attached to fail, and/or can cause the die 30, the interposer substrate 20, and/or the casing 60 to delaminate. Such failures can cause electrical shorts that render the device 10 defective. Accordingly, there is a need to improve the robustness of microelectronic devices.

DETAILED DESCRIPTION

Specific details of several embodiments of the disclosure are described below with reference to packaged microelectronic devices and methods for manufacturing such devices. The microelectronic devices described below include a single microelectronic die attached to a support member, but in other embodiments the microelectronic devices can have two or more stacked microelectronic dies electrically coupled to a support member. The microelectronic devices can include, for example, micromechanical components, data storage elements, optics, read/write components, or other features. The microelectronic dies can be SRAM, DRAM (e.g., DDR-SDRAM), flash-memory (e.g., NAND flash-memory), processors, imagers, and other types of devices. Substrates can be semiconductive pieces (e.g., doped silicon wafers, gallium arsenide wafers, or other semiconductor wafers), non-conductive pieces (e.g., various ceramic substrates), or conductive pieces. Moreover, several other embodiments of the invention can have configurations, components, or procedures different than those described in this section. A person of ordinary skill in the art, therefore, will accordingly understand that the invention may have other embodiments with additional elements, or the invention may have other embodiments without several of the elements shown and described below with reference to FIGS. 2A-4.

Figure 2A:
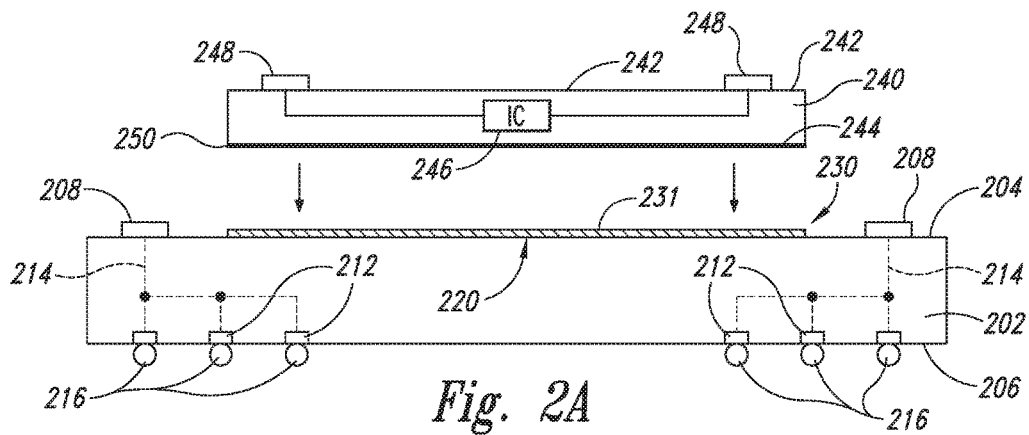
FIGS. 2A-2C illustrate stages in a method for forming a packaged microelectronic device in accordance with an embodiment of the invention.
Figure 2B:
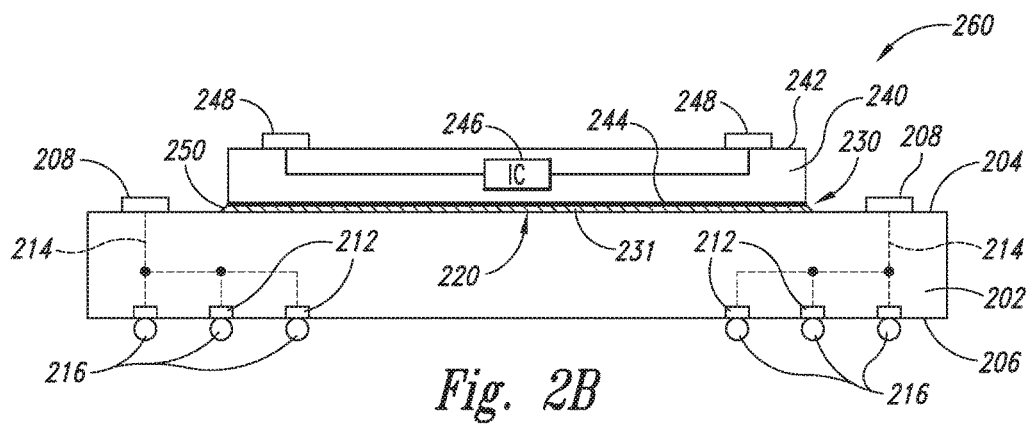
Figure 2C:
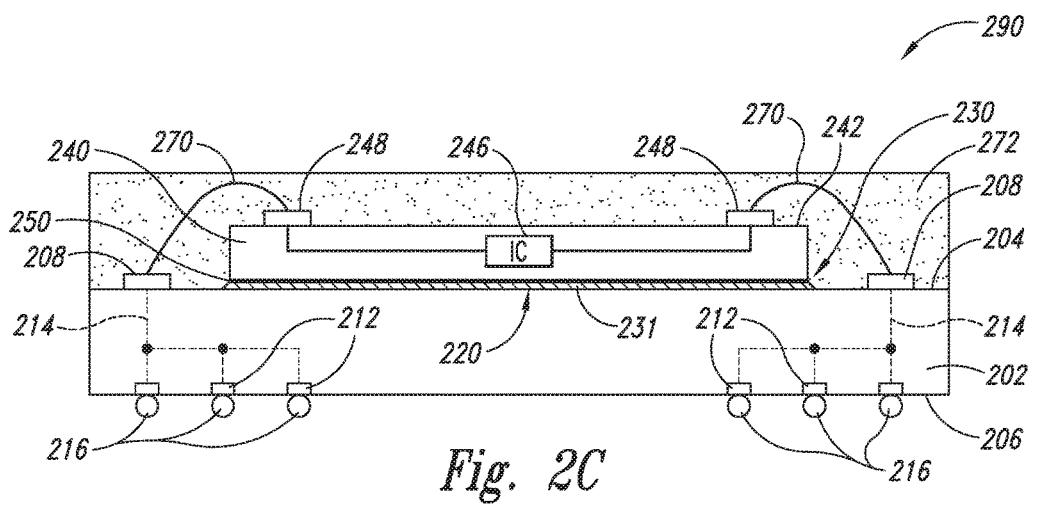

FIGS. 2A-2C illustrate stages of a method for forming a packaged microelectronic device in accordance with one embodiment of the disclosure. More specifically, FIGS. 2A-2C illustrate stages of a method for attaching a back side of a microelectronic die to a support member with a generally rigid solder-based attachment feature or structure. The rigid attachment feature can provide structural support and balance to the stress distribution within the device, thereby resulting in less stress within the individual components of the device and the interfaces between the components.

FIG. 2A, for example, is a partially schematic, side cross-sectional view of a support member 202 and a microelectronic die 240 at an initial stage before the die 240 has been attached to the support member 202. The support member 202 can include an interposer substrate, a printed circuit board, a lead frame, or another suitable support member. The support member 202 can be composed of an organic material, a ceramic material, or another suitable dielectric material. The support member 202 can include a first side 204 and a second side 206 opposite the first side 204. In the illustrated embodiment, the support member 202 is an interposing device that provides an array of ball-pads for coupling very small contacts on the microelectronic die 240 to another type of device (not shown). The support member 202, for example, includes an array of support member terminals 208 at the first side 204, an array of contact pads 212 (e.g., ball-pads) at the second side 206, and a trace 214 or other type of conductive line between each support member terminal 208 and one or more corresponding contact pads 212. The contact pads 212 are arranged in an array for surface mounting the device to a board or module of another device. A plurality of electrical couplers 216 (e.g., solder balls or conductive bumps) can be attached to corresponding contact pads 212. In other embodiments, the support member 202 can include different features and/or the features can have a different arrangement.

The support member 202 in the illustrated embodiment also includes an attachment feature or device 230 disposed on at least a portion of the first side 204 of the support member 202 (e.g., over at least a portion of a die attach region 220). The attachment feature 230 is used to provide the connection between the support member 202 and the die 240, as described in greater detail below. The attachment feature 230 can be composed of a solder material 231, such as a lead-free solder (e.g., a SnAgCu, SnAg, and/or SnAu solder), a solder having another composition, and/or other suitable materials or alloys of materials having the desired properties. Solder compositions generally include an electrically conductive metal and a flux composition. A wide variety of electrically conductive metals may be suitable. In one embodiment, for example, the metal is selected to form a stable metallurgical bond with the material of the die 240 to which the solder material 231 will be attached. The metal of the solder may also be selected to be mechanically and chemically compatible with the other components of the resulting microelectronic device.

The solder material 231 can be deposited onto the support member 202 using a suitable deposition process, such as screen printing (e.g., depositing a solder paste through a solder stencil) or other techniques. The solder material 231 may be deposited over all or a substantial portion of the die attach region 220 on the first side 204 of the support member 202, or the solder material 231 may be deposited in a desired pattern on the support member 202 (e.g., in the form of individual, discrete volumes of solder material arranged in a pattern over the die attach region 220). Representative patterns are described below with reference to FIGS. 3A and 3B. The support member 202 may include a metal or conductive layer (not shown) over at least a portion of the front side 204 and positioned to contact and promote wetting of the solder material 231. In several embodiments, a volume of flux (not shown) may be applied to the solder material before the die 240 is engaged with the attachment feature 230. The flux can be applied, for example, using a spraying process, a screen printing process, or another suitable technique.

The microelectronic die 240 can be a semiconductor die or other type of microelectronic die. The die 240, for example, can be a processor, a memory device, an imager, a sensor, a filter, or other type of microelectronic device. Suitable memory devices, for example, include DRAM and flash memory devices. The die 240 includes an active or front side 242 and a back side 244 opposite the active side 242. The active or front side 242 generally refers to the side of the die 240 that is accessed during formation of the active elements of the die 240. The die 240 also includes integrated circuitry 246 (shown schematically) and a plurality of terminals 248 (e.g., bond-pads) electrically coupled to the integrated circuitry 246. The terminals 248 are arranged in an array at the active side 242 of the die 240. In the illustrated embodiment, the die 240 also includes a conductive layer 250 deposited over at least a portion of the back side 244 of the die 240. The conductive layer 250 may include, for example, a redistribution layer (RDL) applied to at least a portion of the back side 244 to facilitate wetting of the solder material 231 of the attachment feature 230. The RDL, for example, is dedicated to a function of providing a connection between the die 240 and the support member 202. In other embodiments, the conductive layer 250 may include a wettable, metalized layer over at least a portion of the back side 244 of the die 240.

Referring next to FIG. 2B, the die 240 is engaged with the support member 202 to form an assembly 260. More specifically, the back side 244 of the die 240 is engaged with or otherwise placed in contact with the attachment feature 230 such that the assembly 260 has a chip-on-board (COB) configuration. After positioning the back side 244 of the die 240 at the desired position relative to the support member 202, a heating process, commonly referred to as "reflow," is used to metallurgically attach the solder material 231 and the conductive layer 250 to form a generally rigid, robust connection between the back side 244 of the die 240 and the support member 202. The attachment feature 230 may or may not be electrically coupled to internal active structures or features of the die 240 and/or support member 202. In the illustrated embodiment, for example, the die 240 is not electrically coupled to the support member 202 via the attachment feature 230. In other embodiments, however, the die 240 may be electrically coupled to one or more ground structures or ground planes (not shown) of the support member 202 via the attachment feature 230.

FIG. 2C illustrates a subsequent stage in the method in which a plurality of wire bonds 270 or other types of connectors are formed between the terminals 248 on the die 240 and corresponding support member terminals 208 at the first side 204 of the support member 202. Accordingly, as mentioned above, the support member 202 distributes signals from the very small terminals 248 on the die 240 to the larger array of contact pads 212 at the second side 206 of the support member 202. After forming the conductive couplers 270, an encapsulant, shell, or cap 272 can be formed or otherwise deposited onto the assembly to form a packaged microelectronic device 290. The encapsulant 272 enhances the integrity of the device 290 and protects the die 240 and the physical and electrical connections between the die 240 and the support member 202 from moisture, chemicals, and other contaminants.

An embodiment of the method described above with reference to FIG. 2A-2C for forming a microelectronic device 290 includes forming an attachment feature 230 on at least one of the back side 244 of the die 240 and the support member 202. The attachment feature 230 can be composed of a solder material 231. The method can also include contacting the attachment feature 230 with the other of the die 240 and the support member 202, and reflowing the solder material 231 to join the die 240 to the support member 202 via the attachment member 230. In several embodiments, the attachment feature 230 is not electrically connected to internal active structures (e.g., the integrated circuitry 246) of the die 240.

Figure 1A:
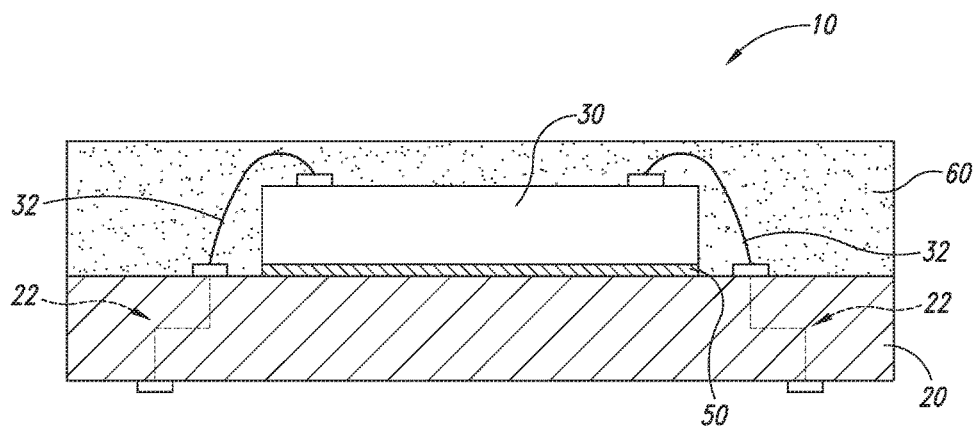
FIG. 1A is a partially schematic side cross-sectional view of a packaged microelectronic device including an interposer substrate and a microelectronic die configured in accordance with the prior art.
Figure 1B:
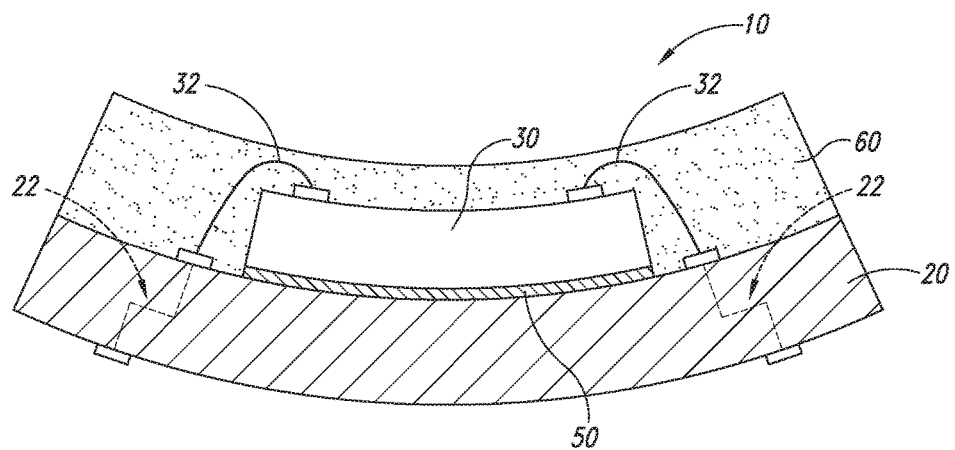
FIG. 1B is a partially schematic side cross-sectional view of the microelectronic device of FIG. 1A after bowing has occurred.

Several embodiments of the microelectronic device 290 described above with reference to FIGS. 2A-2C may provide improved package reliability and robustness as compared with conventional packaged devices having generally flexible connections between the die and corresponding support member. As discussed previously, the generally flexible or compliant connections in conventional devices (FIGS. 1A and 1B) can allow internal components of the devices to warp and/or delaminate, which in turn often leads to failure or malfunction of such devices. In the device 290 shown in FIG. 2C, however, the generally rigid solder-based connection between the back side 244 of the die 240 and the support member 202 provides structural support and a consistent stress distribution within the device 290. The rigid package construction may reduce stress within the individual components of the device 290 and the interfaces between the components, thereby reducing and/or eliminating the tendency for the device 290 to warp or otherwise deform.

Figure 3A:
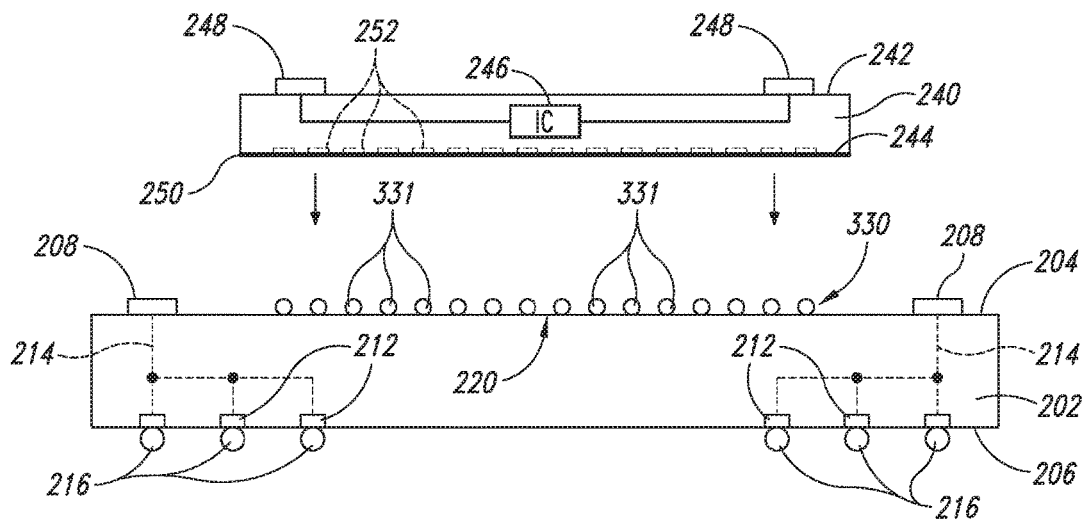
FIGS. 3A and 3B illustrate stages in a method for forming a packaged microelectronic device in accordance with another embodiment of the invention.
Figure 3B:
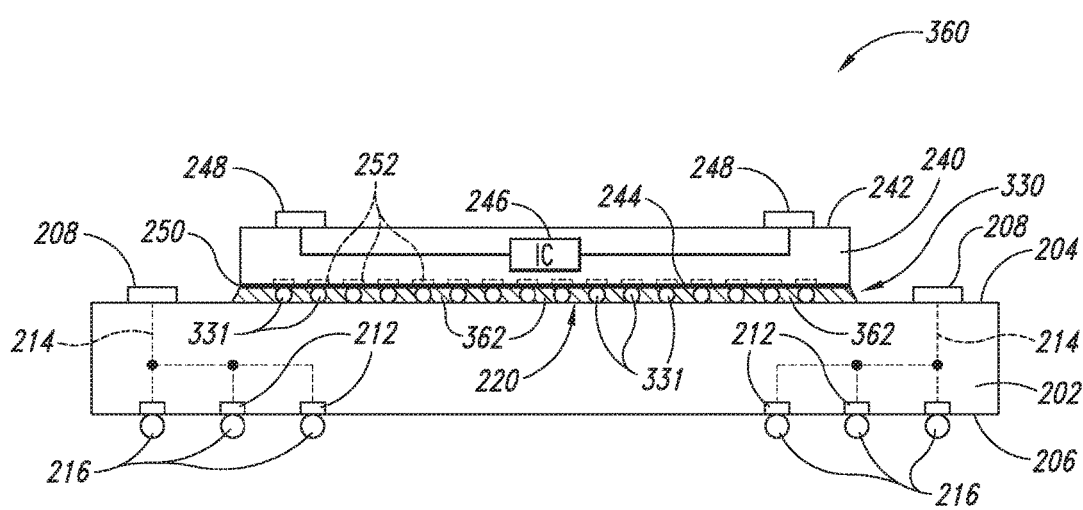

FIGS. 3A and 3B illustrate stages of a method for forming a packaged microelectronic device in accordance with another embodiment of the disclosure. More specifically, FIG. 3A is a partially schematic, side cross-sectional view of the support member 202 and the microelectronic die 240 at an initial stage before the die has been attached to the support member. This stage of the illustrated method differs from the stage described above with reference to FIG. 2A in that the support member 202 includes an attachment feature 330 having a different configuration than the attachment feature 230 of FIG. 2A. In this embodiment, for example, the attachment feature 330 includes a plurality of solder balls or conductive bumps 331 disposed on the first side 204 of the support member 202 in a desired pattern. The solder balls 331 may be composed of materials similar to those discussed above with reference to FIG. 2A. Furthermore, a volume of flux (not shown) may be deposited on to the solder balls 331 before bringing the die 240 into contact with the solder balls 331.

Referring next to FIG. 3B, the back side 244 of the die 240 is engaged with the solder balls 331 of the attachment feature 330 to form an assembly 360. After positioning the die 240 at a desired location relative to the support member 202, a suitable reflow process is used to reflow the solder balls 331 and the conductive layer 250 to form a generally rigid connection between the back side 244 of the die 240 and the support member 202. In the illustrated embodiment, for example, the conductive layer 250 can include a plurality of conductive pads or balls 252 (shown in broken lines) arranged in a pattern at the back side 244 of the die 240 corresponding at least in part to the arrangement of solder balls 331 on the support member 202. In other embodiments, however, the conductive layer 250 may include a wettable, metalized layer or another configuration suitable for wetting the solder balls 331.

After reflowing the solder balls 331 and conductive layer 250, a fill material 362 can be applied to the interface between the die 240 and the support member 202. The fill material can protect the connection formed between the die 240 and the support member 202 by the solder balls 331, and can prevent moisture, chemicals, and other contaminants from entering the interstitial spaces between these components. The fill material 362, for example, can wick into the spaces between the back side 244 of the die 240 and the support member 202 and around the periphery of the die 240. The fill material 362 can include a molding compound, such as an epoxy resin, or other suitable materials. After encapsulation, the assembly 360 can undergo additional processing as described above with respect to FIG. 2C to form a packaged microelectronic device.

Figure 4:
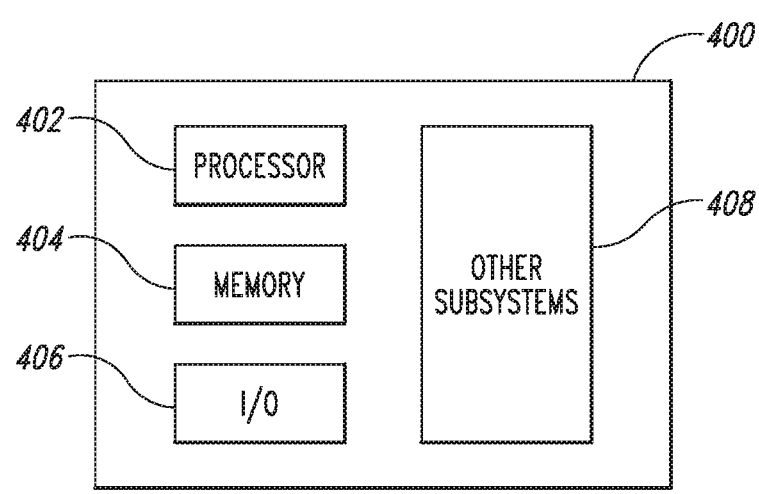
FIG. 4 is a schematic illustration of a system in which the microelectronic devices may be incorporated.

Any one of the packaged microelectronic devices described above with reference to FIGS. 2A-3B can be incorporated into any of a myriad of larger and/or more complex systems, a representative example of which is system 400 shown schematically in FIG. 4. The system 400 can include a processor 402, a memory 404 (e.g., SRAM, DRAM, flash, and/or other memory device), input/output devices 406, and/or other subsystems or components 408. The microelectronic devices described above with reference to FIGS. 2A-3B may be included in any of the components shown in FIG. 4. The resulting system 400 can perform any of a wide variety of computing, processing, storage, sensing, imaging, and/or other functions. Accordingly, representative systems 400 include, without limitation, computers and/or other data processors, for example, desktop computers, laptop computers, Internet appliances, hand-held devices (e.g., palm-top computers, wearable computers, cellular or mobile phones, personal digital assistants, etc.), multi-processor systems, processor-based or programmable consumer electronics, network computers, and mini computers. Other representative systems 400 include cameras, light or other radiation sensors, servers and associated server subsystems, display devices, and/or memory devices. Components of the system 400 may be housed in a single unit or distributed over multiple, interconnected units (e.g., through a communications network). The components of the system 400 can accordingly include local and/or remote memory storage devices, and any of a wide variety of computer-readable media.

From the foregoing, it will be appreciated that specific embodiments of the invention have been described herein for purposes of illustration, but that various modifications may be made without deviating from the invention. For example, specific elements of any of the foregoing embodiments can be combined or substituted for other elements in other embodiments. In particular, for example, the solder-based attachment feature may initially be attached to the support member (as shown in the Figures) before being attached to the microelectronic die, or the attachment feature may initially be attached to the microelectronic die. Further, the solder material may have other shapes or forms in addition to, or in lieu of, the solder layer and solder balls described above. Moreover, in several embodiments one or more additional microelectronic dies can be stacked on the die 240 and electrically coupled to the corresponding die and/or support member. Accordingly, the invention is not limited except as by the appended claims.

We claim:

1. A system, comprising:
   at least one of a processor and a memory device, wherein at least one of the processor and the memory device includes a semiconductor component comprising—
   an interposer substrate including a plurality of first terminals;
   a microelectronic die having an active side, a back side opposite the active side and facing toward the interposer substrate, integrated circuitry, and a plurality of second terminals at the active side and electrically coupled to the integrated circuitry, and wherein the second terminals at the active side of the microelectronic die are electrically coupled to corresponding first terminals of the interposer substrate with a plurality of wire bonds; and a connection structure composed of a volume of solder material between the interposer substrate and the microelectronic die, wherein the connection structure is attached to both the interposer substrate and the back side of the microelectronic die, wherein the connection structure includes at least one of (a) a single, unitary structure covering approximately all of the back side of the microelectronic die, and (b) a structure electrically isolated from internal active features of the microelectronic die.

2. The system of claim 1 wherein the microelectronic die is electrically coupled to one or more grounding structures of the interposer substrate via the connection structure.

3. The system of claim 1 wherein the volume of solder material comprises a plurality of pre-formed solder balls, and wherein the solder balls do not transmit signals between the microelectronic die and the interposer substrate.

4. The system of claim 1 wherein the microelectronic die further comprises a conductive layer at the back side of the microelectronic die and in contact with the connection structure.

5. The system of claim 1 wherein the volume of solder material between the interposer substrate and the microelectronic die has a generally uniform thickness.

6. The system of claim 1, further comprising an encapsulant over the interposer substrate and at least partially covering the microelectronic die, first terminals, second terminals, and wire bonds.

7. The system of claim 1 wherein the connection structure is composed of SnAgCu, SnAg, or SnAu solder.

8. The system of claim 1 wherein the connection structure is formed of a lead-free solder material.

9. The system of claim 1 wherein the microelectronic die comprises one of an imager, a filter, or a sensor.

* * * * *